United States Patent
Chang et al.

(10) Patent No.: US 10,535,593 B2
(45) Date of Patent: *Jan. 14, 2020

(54) PACKAGE STRUCTURE HAVING A PLURALITY OF CONDUCTIVE BALLS WITH NARROW WIDTH FOR BALL WAIST

(71) Applicant: Taiwan Semiconductor Manufacturing Co., Ltd., Hsinchu (TW)

(72) Inventors: Pi-Lan Chang, Kaohsiung (TW); Chen-Shien Chen, Hsinchu County (TW); Chin-Yu Ku, Hsinchu (TW); Hsu-Hsien Chen, Hsinchu (TW); Wei-Chih Huang, Taipei (TW); Chun-Ying Lin, Yunlin County (TW); Li-Chieh Chou, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/396,767

(22) Filed: Apr. 29, 2019

(65) Prior Publication Data
US 2019/0252304 A1   Aug. 15, 2019

Related U.S. Application Data

(63) Continuation of application No. 15/798,416, filed on Oct. 31, 2017, now Pat. No. 10,276,481.
(Continued)

(51) Int. Cl.
*H01L 23/34* (2006.01)
*H01L 23/48* (2006.01)
(Continued)

(52) U.S. Cl.
CPC .... *H01L 23/49816* (2013.01); *H01L 21/4853* (2013.01); *H01L 21/4857* (2013.01);
(Continued)

(58) Field of Classification Search
CPC .......... H01L 23/49816; H01L 21/4853; H01L 21/4857; H01L 21/561; H01L 23/3114;
(Continued)

(56) References Cited

U.S. PATENT DOCUMENTS

| | | | |
|---|---|---|---|
| 6,425,516 B1 * | 7/2002 | Iwatsu ................. | B23K 3/0623 228/180.22 |
| 10,276,481 B2 * | 4/2019 | Chang ............... | H01L 23/49816 |
| 2016/0204079 A1 * | 7/2016 | Lu ........................... | H01L 25/04 257/668 |

* cited by examiner

*Primary Examiner* — Alonzo Chambliss
(74) *Attorney, Agent, or Firm* — JCIPRNET

(57) ABSTRACT

A package structure including a circuit substrate, a semiconductor die, a redistribution layer, a plurality of conductive balls and a circuit substrate is provided. The redistribution layer is disposed on the semiconductor die, and being electrically connected to the semiconductor die. The plurality of conductive balls is disposed between the redistribution layer and the circuit substrate. The semiconductor die is electrically connected to the circuit substrate through the conductive balls. Each of the conductive balls has a ball foot with a first width D1, a ball head with a third width D3 and a ball waist with a second width D2 located between the ball foot and the ball head. The ball foot is connected to the redistribution layer, the ball head is connected to the circuit substrate, and the ball waist is the narrowest portion of each of the conductive balls.

20 Claims, 6 Drawing Sheets

Related U.S. Application Data

(60) Provisional application No. 62/524,619, filed on Jun. 26, 2017.

(51) Int. Cl.
| | | |
|---|---|---|
| *H01L 21/00* | (2006.01) | |
| *H01L 23/498* | (2006.01) | |
| *H01L 23/31* | (2006.01) | |
| *H01L 21/56* | (2006.01) | |
| *H01L 21/48* | (2006.01) | |
| *H01L 25/065* | (2006.01) | |
| *H01L 23/00* | (2006.01) | |

(52) U.S. Cl.
CPC ............ *H01L 21/56* (2013.01); *H01L 21/561* (2013.01); *H01L 23/3114* (2013.01); *H01L 23/49822* (2013.01); *H01L 24/81* (2013.01); *H01L 25/0657* (2013.01); *H01L 21/568* (2013.01); *H01L 23/3128* (2013.01); *H01L 2224/18* (2013.01)

(58) Field of Classification Search
CPC ............... H01L 23/49822; H01L 24/81; H01L 25/0657
See application file for complete search history.

PACKAGE STRUCTURE HAVING A PLURALITY OF CONDUCTIVE BALLS WITH NARROW WIDTH FOR BALL WAIST

CROSS-REFERENCE TO RELATED APPLICATION

This application is a continuation application of U.S. application Ser. No. 15/798,416, filed on Oct. 31, 2017, now allowed. The prior application Ser. No. 15/798,416 claims the priority benefits of U.S. provisional application Ser. No. 62/524,619, filed on Jun. 26, 2017. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
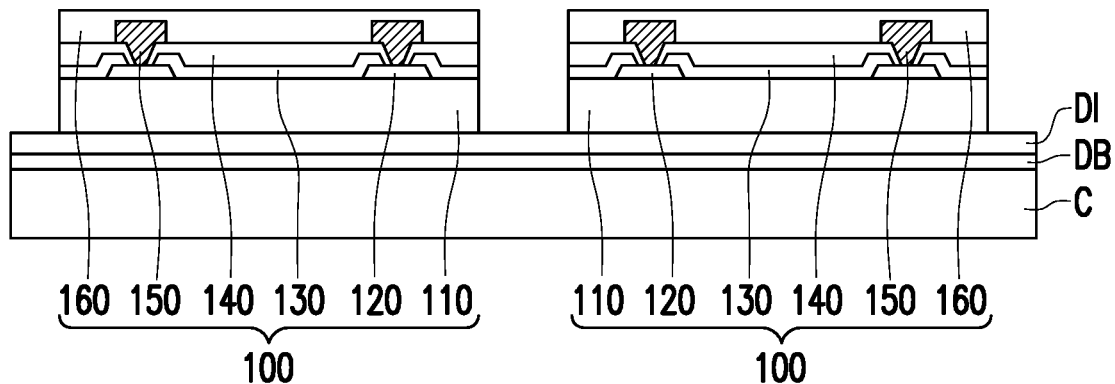
FIG. 1A to FIG. 1I are schematic cross sectional views of various stages in a manufacturing method of a package structure according to some exemplary embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic cross sectional views of various stages in a manufacturing method of a package structure according to some exemplary embodiments. As shown in FIG. 1A, a carrier C having a de-bonding layer DB and a dielectric layer DI formed thereon is provided. The de-bonding layer DB is located in between the carrier C and the dielectric layer DI. In some embodiments, the carrier C is a semiconductor carrier or a glass substrate. In some embodiments, the de-bonding layer DB is a light-to-heat conversion (LTHC) release layer formed on the glass substrate. In some embodiments, the dielectric layer DI is a polyimide (PI) layer or a polybenzoxazole (PBO) layer formed on the de-bonding layer DB.

In the exemplary embodiment, as shown in FIG. 1A, a plurality of semiconductor dies 100 (or integrated circuit components) is provided, and the semiconductor dies may be picked and placed on the dielectric layer DI. Although two semiconductor dies 100 are shown in FIG. 1A, however, the number of semiconductor dies are not limited thereto, and this can be adjusted based on requirement. In the exemplary embodiment, the semiconductor die 100, for example, includes a semiconductor substrate 110, a plurality of conductive pads 120, a passivation layer 130, a post passivation layer 140, a plurality of conductive vias 150, and a protection layer 160. In some embodiments, the passivation layer 130 is formed over the semiconductor substrate 110 and has openings that partially expose the conductive pads 120 on the semiconductor substrate 110. The semiconductor substrate 110 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 120 may be aluminum pads, copper pads or other suitable metal pads. The passivation layer 130 may be a silicon oxide layer, a silicon nitride layer, a silicon oxy-nitride layer or a dielectric layer formed of any suitable dielectric materials. In the exemplary embodiment, the post-passivation layer 140 is optionally formed over the passivation layer 130. The post-passivation layer 140 covers the passivation layer 130 and has a plurality of contact openings. The conductive pads 120 are partially exposed by the contact openings of the post passivation layer 140. The post-passivation layer 140 may be a benzocyclobutene (BCB) layer, a polyimide layer, a polybenzoxazole (PBO) layer, or a dielectric layer formed by other suitable polymers. In some embodiments, the conductive pillars or conductive vias 150 are formed on the conductive pads 120 by plating. In some embodiments, the protection layer 160 is formed on the post passivation layer 140 covering the conductive pillars or conductive vias 150 so as to protect the conductive pillars or conductive vias 150.

In some embodiments, the semiconductor dies 100 are placed on the dielectric layer DI, and the semiconductor die 100 is attached (or adhered) to the dielectric layer DI through a die attach film (not shown). In some alternative embodiments, the semiconductor dies 100 placed on the dielectric layer DI may be arranged in arrays. In some embodiments, a plurality of through insulator vias (not shown) may be optionally formed on the dielectric layer DI before placing the semiconductor dies 100, if further connection is needed for the backside of the package or double-sided connection is required based on the product design. It is understood that the disclosure is not limited by the examples provided herein.

Figure 1B:
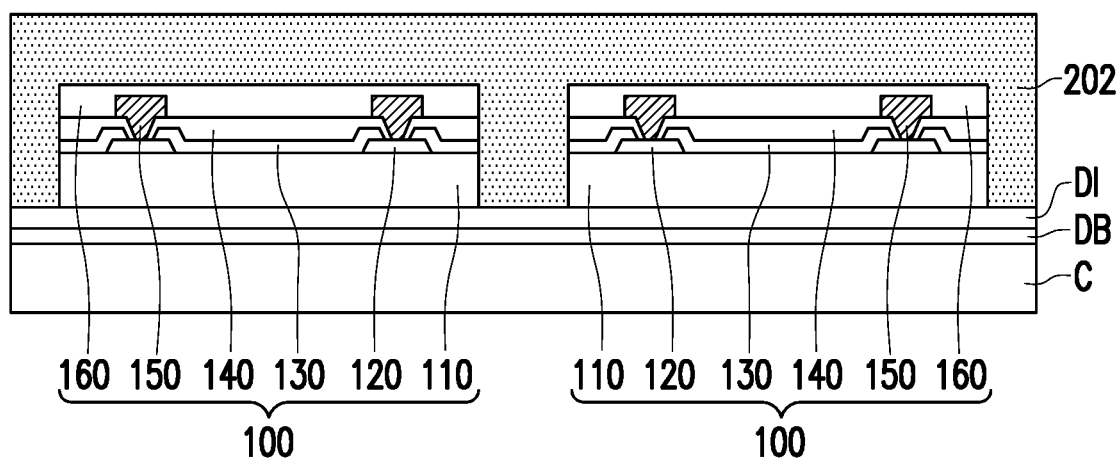

Referring to FIG. 1B, an insulating material 202 is formed on the dielectric layer DI and over the semiconductor dies 100 (forming encapsulated semiconductor dies). In some embodiments, the insulating material 202 is formed through, for example, a compression molding process, filling up the gaps between the semiconductor dies 100 and encapsulating the semiconductor dies 100. The conductive pillars or conductive vias 150 and the protection layer 160 of the semiconductor die 100 are encapsulated by and well protected by the insulating material 202. In other words, the conductive pillars or conductive vias 150 and the protection layer 160 of the semiconductor die 100 are not revealed and are well protected by the insulating material 202. In some embodiments, the insulating material 202 includes epoxy resins or other suitable resins.

Figure 1C:
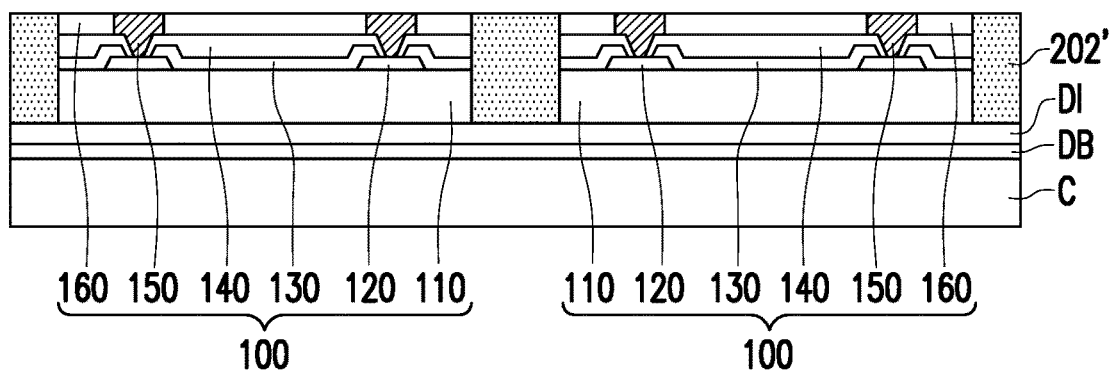
Figure 1D:
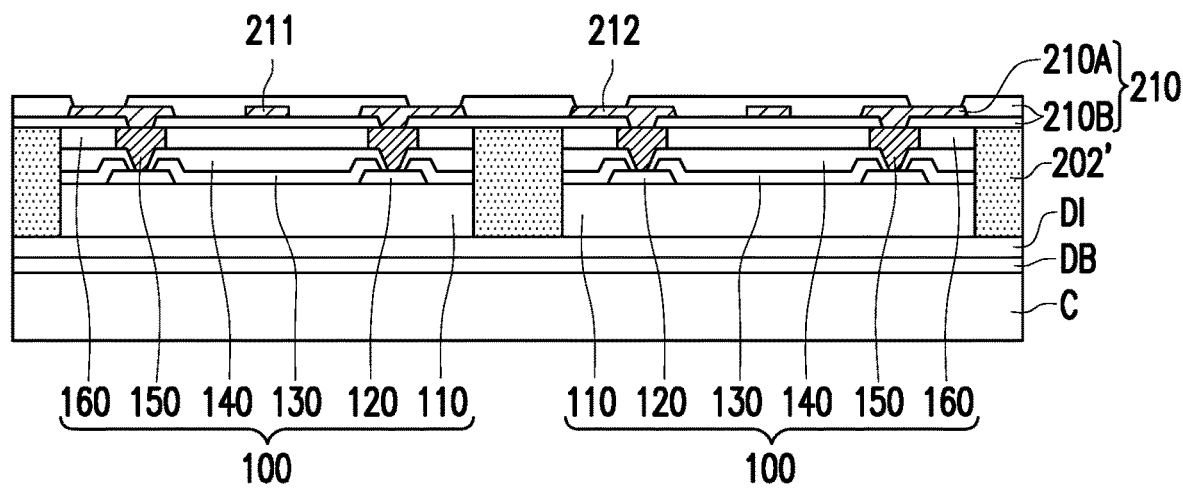

Referring to FIG. 1C, at least the insulating material 202 is partially removed to expose the conductive pillars 150. In some embodiments, the insulating material 202 and the protection layer 160 are ground or polished by a mechanical grinding process and/or a chemical mechanical polishing (CMP) process until the top surfaces of the conductive pillars 150 are exposed. The insulating material 202 is polished to form an encapsulant 202'. In some embodiments, the top surfaces of the encapsulant 202', the conductive pillars 150, and the polished protection layer 160 are coplanar and leveled with one another.

Referring to FIG. JD, a redistribution layer 210 is formed on the semiconductor die 100 and the encapsulant 202'. In some embodiments, the redistribution layer 210 includes at least an inter-dielectric layer 210B and a conductive layer 210A sandwiched between the inter-dielectric layer 210B. In some alternative embodiments, depending on the routing design, the redistribution layer 210 may include a plurality of inter-dielectric layers 210B and a plurality of conductive layers 210A stacked alternately. In some embodiments, the conductive layer 210A is electrically connected to the conductive pillars 150 of the semiconductor die 100. In some embodiments, the conductive layer 210A may include routing traces 211 and pads 212. In some embodiments, the pads 212 function as ball pads for the receiving the subsequently formed conductive portions or balls.

Figure 1E:
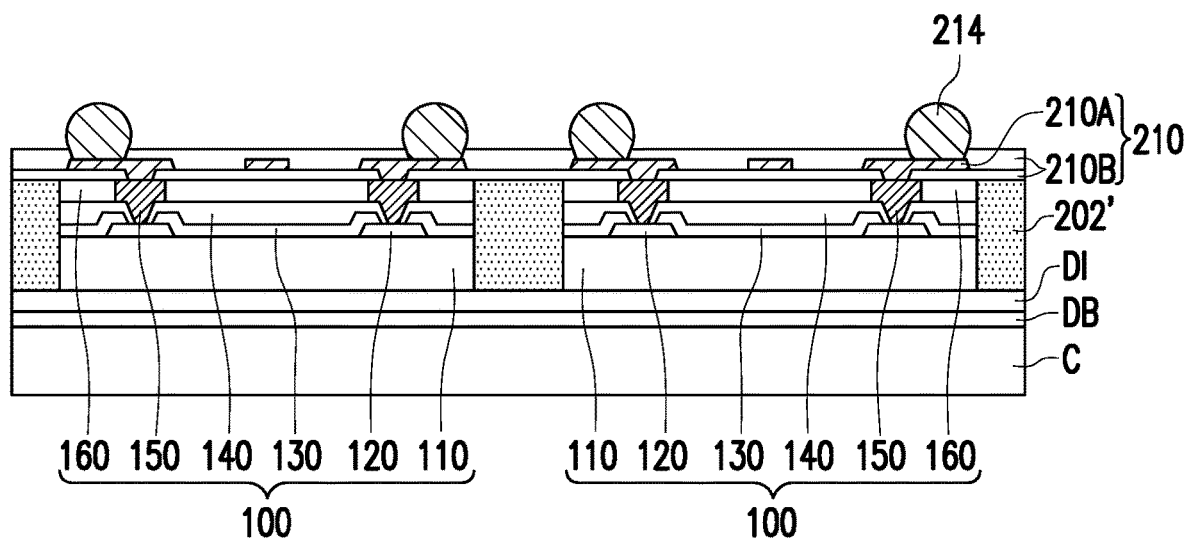

Referring to FIG. 1E, after forming the redistribution layer 210, a plurality of first conductive portions 214 are disposed on the redistribution layer 210. In some embodiments. the first conductive portions 214 are, for example, solder balls or lead free solder balls. In some embodiments, the first conductive portions 214 are placed on the pads 212 of the conductive layer 210A of the redistribution layer 210. In some embodiments, a material of the first conductive portions 214 includes, for example, tin, silver, copper, nickel, bismuth, zinc, manganese, antimony, indium, cadmium, gold and/or alloys thereof. In some embodiments, before placing the first conductive portions 214, a solder flux may be applied and the first conductive portions 214 are attached to the pads 212 of the conductive layer 210A through the solder flux. In certain embodiments, the first conductive portions 214 are placed on the conductive layer 210A through a ball placement process. In some embodiments, the first conductive portions 214 are electrically connected to the semiconductor dies 100 through the conductive layer 210A of the redistribution layer 210. In some embodiments, the first conductive portions 214 are disposed directly on the pads 212 of the conductive layer 210A without under-ball metallurgy (UBM) patterns there-between. In some alternative embodiments, depending on the product designs, UBM patterns may be present. In some exemplary embodiments, a partial melting process may be performed after disposing the plurality of first conductive portions 214 on the conductive layer 210A of the redistribution layer 210, which may assist better adherence to the pads 212. In some embodiments, the partial melting process is performed right after disposing the first conductive portions 214 and before forming an upholding layer over the redistribution layer 210. In certain embodiments, the partial melting process is performed at a temperature of about 220° C. to about 265° C. for 20 seconds to 40 seconds, so as to partially melt the plurality of first conductive portions 214.

Figure 1F:
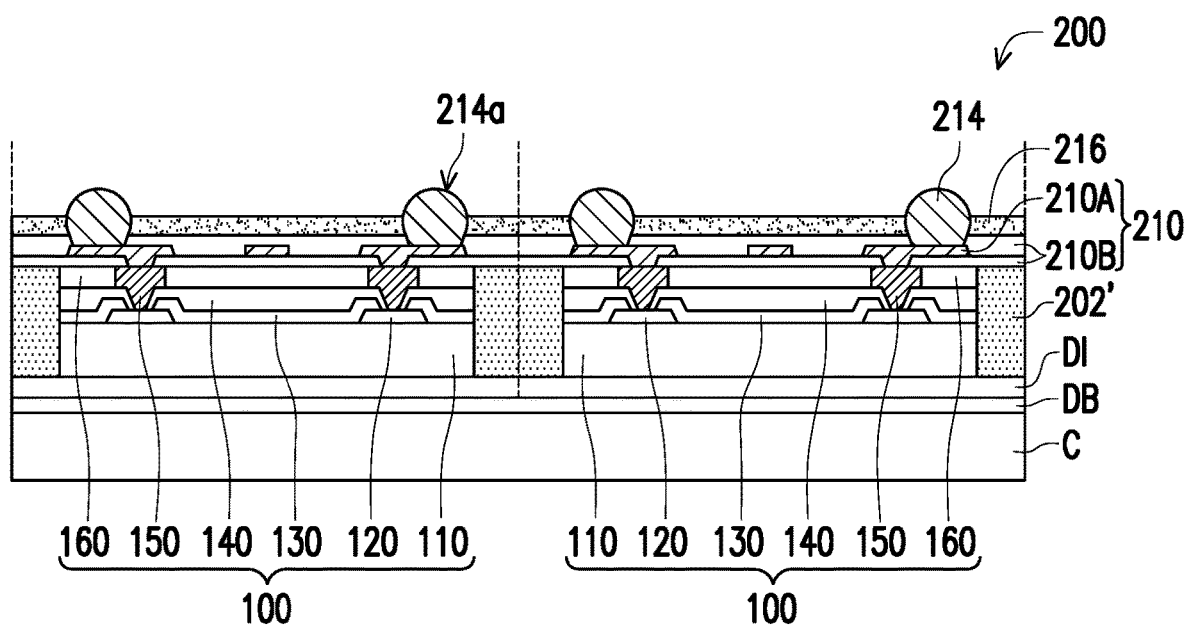

Referring to FIG. 1F, after disposing the first conductive portions 214, an upholding layer 216 is formed to partially cover the first conductive portions 214. In some embodiments, the upholding layer 216 is formed with a thickness large enough to partially cover the first conductive portions 214, but not enough to fully cover the total height of the first conductive portions 214, for example. In some embodiments, the material of the upholding layer 216 includes, for example, an epoxy-based resin, a phenolic resin or any other suitable type of molding materials. In some embodiments, the upholding layer 216 is formed by providing a molding material over the redistribution layer 210 and partially covering the first conductive portions 214 and then curing the molding material on the redistribution layer 210. In some embodiments, the molding material may include epoxy-based resins, which is a semi-solid at high temperatures. In some embodiments, the material of the upholding layer 216 may be different to the material of the encapsulant 202'. In some embodiments, the material of the upholding layer 216 may be the same as the material of the encapsulant 202'. In certain embodiments, the upholding layer 216 is formed to fill the space between the first conductive portions 214. In some embodiments, the upholding layer 216 partially encapsulates the first conductive portions 214, but at least exposes tops 214a of the first conductive portions 214. In certain embodiments, the upholding layer 216 holds the first conductive portions 214 and reinforces the connection between the first conductive portions 214 and the redistribution layer 210.

Figure 1G:
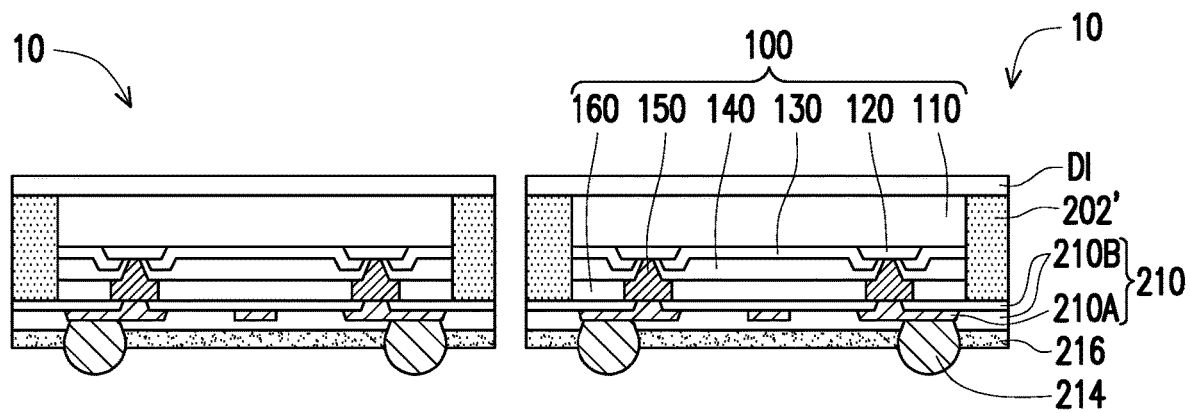

Referring to FIG. 1G, after forming the upholding layer 216, a wafer dicing process is performed to cut the whole wafer structure 200 into a plurality of packages 10 so as to separate each of the semiconductor dies 100. In some embodiments, the wafer dicing process is performed to cut the whole wafer structure 200 along the cutting lines (the dotted line in FIG. 1F) into the individual packages 10, each package 10 including at least one semiconductor die 100. In some embodiments, the wafer dicing process is performed by using blade saw technology. Alternatively, in some embodiments, the packages 10 are separated from one another by using laser cutting technology. In some embodiments, the whole wafer structure 200 may be turned upside down before the wafer cutting process. In certain embodiments, the dielectric layer DI is separated from the de-bonding layer DB and the carrier C. In some embodiments, the dielectric layer DI can be peeled from the carrier C by irradiating laser onto the de-bonding layer DB (e.g., the LTHC release layer). In some embodiments, the manufacturing process described above may be part of a wafer level packaging process, and additional process steps may be performed if additional layers or additional package subunits are further connected to the packages 10.

Figure 1H:
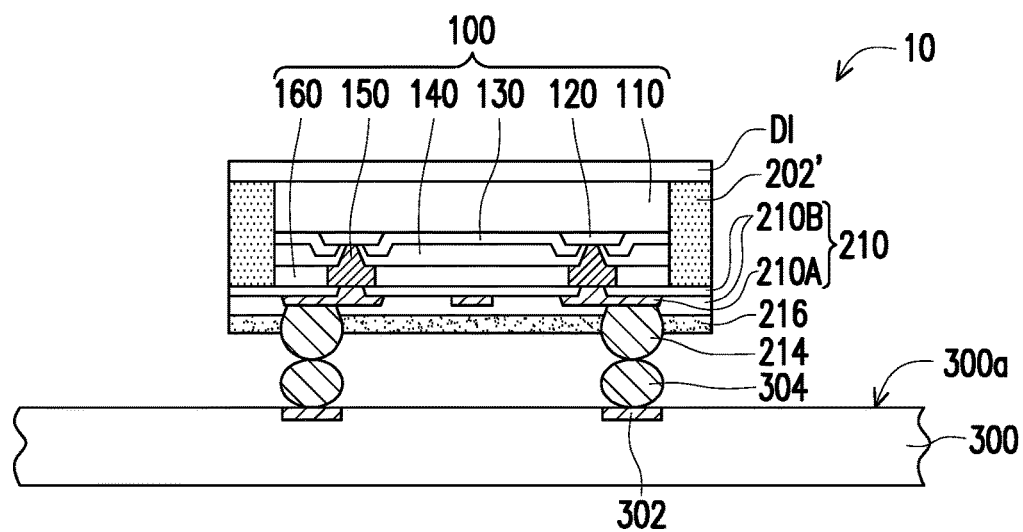

After separating the individual packages 10, as shown in FIG. 1H, at least one package 10 is mounted to a circuit substrate 300 with the first conductive portions 214 and second conductive portions 304 placed in-between. In certain embodiments, the first conductive portions 214 of the semiconductor die 100 are in contact with the second conductive portions 304, and the second conductive portions 304 are in direct contact with the conductive pads 302 of the circuit substrate 300. In some embodiments, the second conductive portions 304 are, for example, solder pastes. In some exemplary embodiments, the material of the second conductive portions 304 is the same as the material of the first conductive portions 214. In some exemplary embodiments, the material of the second conductive portions 304 is different from the material of the first conductive portions 214. In certain embodiments, the second conductive portions 304 are printed or applied to conductive pads 302 of the circuit substrate 300 prior to mounting the package(s) 10 to the circuit substrate 300. Alternatively, the second conductive portions 304 may be applied on the first conductive portions 214 before mounting.

Figure 1I:
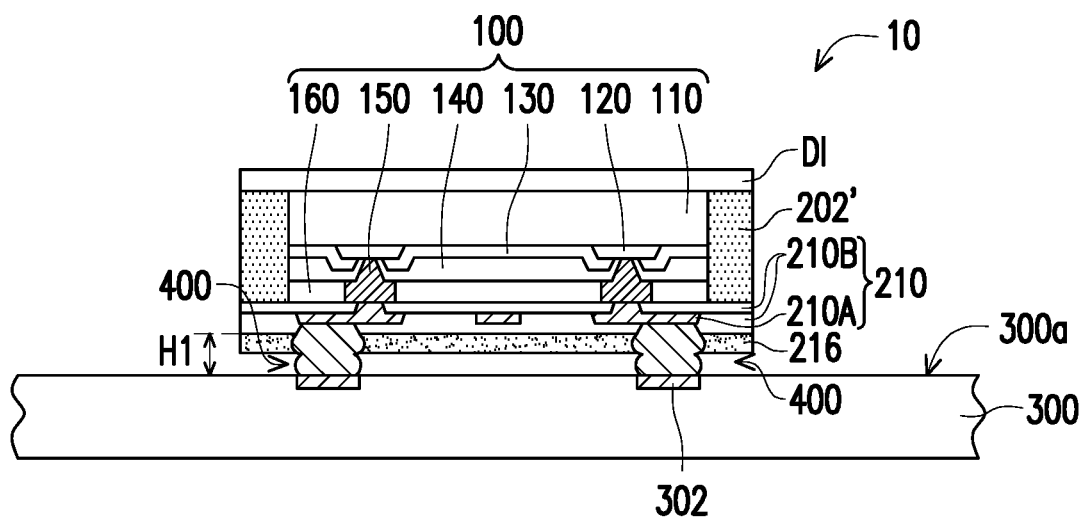

Referring to FIG. 1I, a solder joining process is performed. In some embodiments, through the solder joining process, each of the second conductive portions 304 is joined with each of the first conductive portions 214 to constitute one of the conductive balls 400. In some embodiments, the solder joining process includes a reflow process. In some exemplary embodiments, the reflow temperature and the reaction time of the reflow process are similar or the same conditions as the partial melting process mentioned in FIG. 1E (about 220° C. to about 265° C.). In certain embodiments, the formed conductive balls 400 have a calabash shape. In certain embodiments, the formed conductive balls 400 have a ball height H1 measuring along the direction perpendicular to the plane of the top surface 300a of the circuit substrate 300, wherein the ball height H1 is in a range of 160 μm to 200 μm. As showing in FIG. 1E, after forming the conductive balls 400, the circuit substrate 300 is electrically connected to the redistribution layer 210 through the conductive balls 400. Detailed description of different conductive balls 400 that are formed maybe referred to the embodiments shown in FIG. 3A and FIG. 3B thereafter. In some embodiments, as no underfill is applied between the circuit substrate 300 and the redistribution layer 210, the conductive balls are partially exposed and the reliability of the package is improved due to better heat dissipation.

Figure 2:
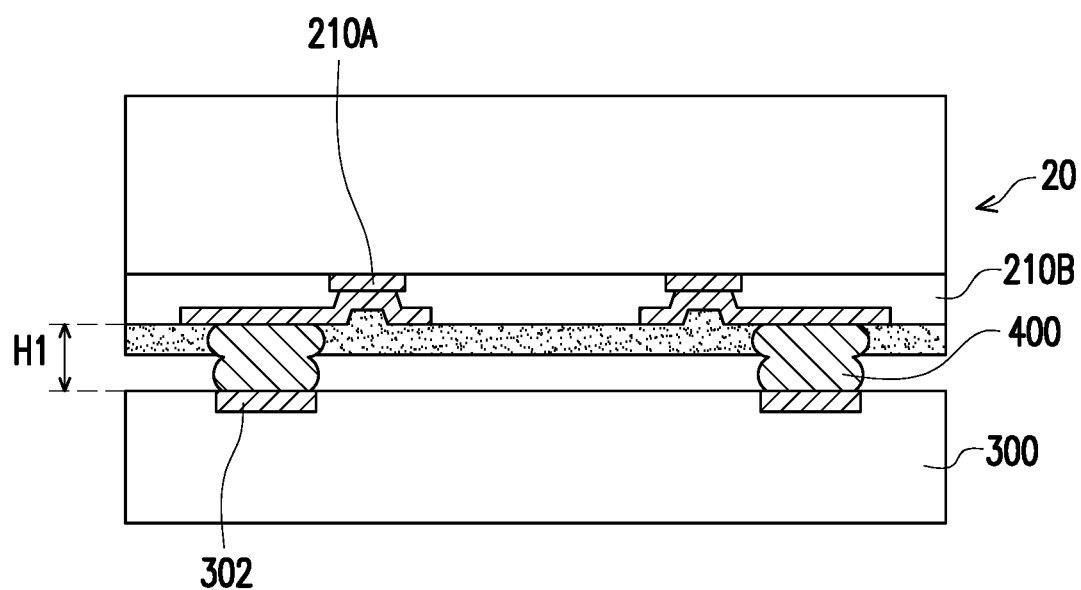
FIG. 2 is a schematic cross sectional view of one stage of a manufacturing method of a package structure according to some exemplary embodiments.

FIG. 2 is a schematic cross sectional view of one stage of a manufacturing method of a package structure according to some exemplary embodiments. The embodiment shown in FIG. 2 is similar to the embodiment of FIG. 1I, therefore, the same reference numerals are used to refer to same or like parts, and its description will be omitted herein. The difference between the embodiment of FIG. 2 and the embodiment of FIG. 1I, is that the package 10 of FIG. 1 is directed to fan-out packages, whereas the package 20 of FIG. 2 is directed to chip-scale packages or fan-in packages. The same general mechanism shown in FIG. 1A to FIG. 1I may be adopted to form the conductive balls 400 with calabash shape as shown in FIG. 2.

Figure 3A:
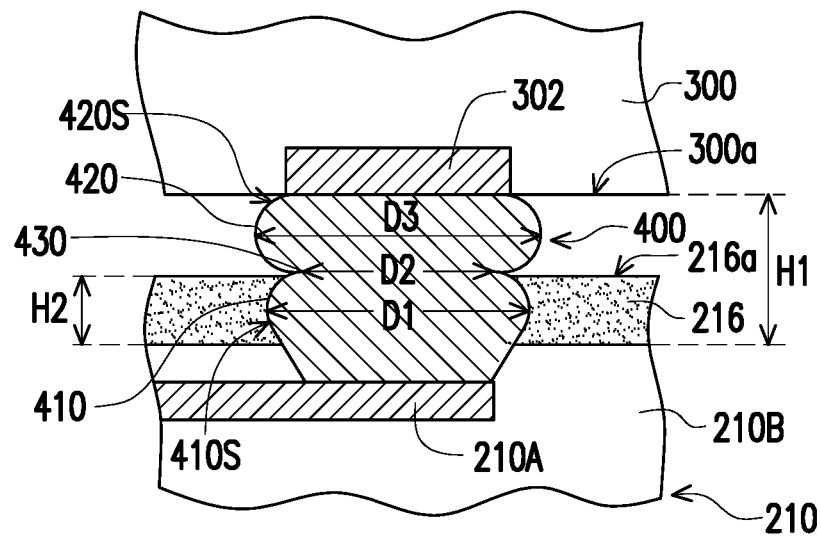
FIG. 3A is a schematic cross-sectional view of a portion of a package structure including a conductive ball according to some exemplary embodiments.

FIG. 3A is a schematic cross-sectional view of a portion of a package including at least a conductive ball according to some exemplary embodiments. FIG. 3A shows an enlarged view of the conductive balls 400 of the package structure 10(20) formed in the step shown in FIG. 1I (or FIG. 2) in accordance with one embodiment. As shown in FIG. 3A, each of the conductive balls 400 presented in FIG. 1I (or FIG. 2) is constituted with three portions and such three portions include a ball foot 410 with a first width D1, a ball waist 430 with a second width D2 and a ball head 420 with a third width D3. In some embodiments, the portion of the conductive ball 400 that is in direct contact with the conductive layer 210A of the redistribution layer 210 is the ball foot 410, which may be treated as a first terminal of the conductive balls 400. In some embodiments, the portion of the conductive ball 400 that is in direct contact with the conductive pads 302 is the ball head 420, which may be treated as a second terminal of the conductive balls 400. In some embodiments, the portion of the conductive ball 400 located between the ball head and the ball foot is the ball waist. In some embodiments, the ball foot 410 (first terminal) disposed on the conductive layer 210A is electrically connected to the redistribution layer 210. In some embodiments, the ball head 420 (second terminal) disposed on the conductive pad 302 is electrically connected to the circuit substrate 300 through the conductive pad(s) 302. In some embodiments, the ball foot 410 is sandwiched in between the redistribution layer 210, the ball waist 430 and the upholding layer 216. In some embodiments, an upper surface 216a of the upholding layer 216 is leveled with the ball waist 430. The upholding layer 216 may for example, be used to define the ball waist 430 of the conductive ball 400 during the solder joining process as mentioned in FIG. 1I. In some embodiments, the ball head 420 is between the ball waist 430 and the circuit substrate 300. In certain embodiments, the ball waist 430 may be formed at an interface formed by joining the first and second conductive portions 214, 304 (FIG. 1H), which correspondingly turn into the ball foot 410 and the ball head 420. In some embodiments, when following the joining process in FIGS. 1H-1I, the first conductive portion 214 forms the ball foot 410 of each of the conductive balls 400, the second conductive portion 304 forms a ball head 420 of each of the conductive balls 400, and the ball waist 430 is formed at an interface wherein the first and second conductive portions are joined. That is, the ball foot is connected to the redistribution layer, the ball head is connected to the circuit substrate.

As shown in FIG. 3A, in some embodiments, view from the cross-section along the height direction, the ball foot 410 (first terminal) has curved sidewalls 410S, and the ball head 420 (second terminal) has curved side walls 420S. In the illustrated embodiment, the ball waist 430 is located between the curved sidewalls 410S of the ball foot 410 (first terminal) and the curved side walls 420S of the ball head 420 (second terminal). In certain embodiments, the formed conductive balls 400 have a calabash shape. In some embodiments, the ball foot 410 and ball head 420 are shaped like middle-wide curved barrels with a narrow ball waist 430 located in-between. Furthermore, as shown in FIG. 3A, the upholding layer 216 partially covers and surrounds the plurality of conductive balls 400. In some embodiments, the upholding layer 216 fully covers the sidewalls 410S of the ball foot 410 (first terminal) and reaches the ball waist 430 of the conductive ball 400, whereas the ball head 420 (second terminal) is exposed by the upholding layer 216. In some embodiments, a height H1 of the conductive balls 400 is about half of a height H2 of the upholding layer 216. In certain embodiments, the height H1 of the conductive balls 400 ranges from about 160 μm to 200 μm, while the height H2 of the upholding layer 216 ranges from about 80 μm to 100 μm, but the disclosure is not limited thereto.

As illustrated in the embodiment of FIG. 3A, each of the conductive balls 400 satisfies the relationship: D3>D1>D2. That is, the third width D3 of the ball head 420 (second terminal) is greater than the first width D1 of the ball foot 410 (first terminal), whereas the first width D1 of the ball foot 410 (first terminal) is greater than the second width D2 of the ball waist 430. In some embodiments, for the ball foot 410 with the first width D1, the ball waist 430 with the second width D2 and the ball head 420 with the third width D3, the first width D1 is a maximum width measuring from a widest portion of the ball foot 410 (first terminal), whereas the third width D3 is a maximum width measuring from a widest portion of the ball head 420 (second terminal), measuring along the plane parallel to the surface 300a of the circuit substrate 300. In certain embodiments, the second width D2 is a minimum width of the ball waist 430, measuring along the plane parallel to the surface 300a of the circuit substrate 300. In certain embodiments, the ball head 420 of the third width D3 is the widest portion of each of the conductive balls 400. In this case, the stress from the connection portions (i.e. ball head or ball foot) may be transferred to ball waist, thus avoiding cracking or splitting from the substrate or die. Furthermore, in some embodiments, when each of the conductive balls satisfies the relationship of D3>D1>D2, a ratio of D1:D2:D3 is in a range from 1.1:1.0:1.5 to 1.2:1.1:1.25. In certain embodiments, the first width D1 is in a range of 220 μm to 240 μm, the second width D2 is in a range of 200 μm to 220 μm, and the third width D3 is in a range of 230 μm to 250 μm, but the disclosure is not limited thereto.

Figure 3B:
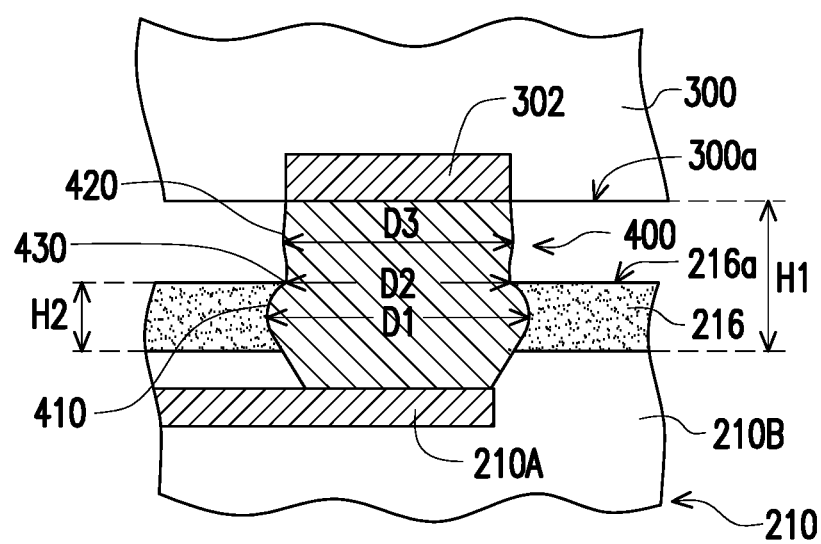
FIG. 3B is a schematic cross-sectional view of a portion of a package structure including a conductive ball according to some exemplary embodiments.

FIG. 3B is a schematic cross-sectional view of a portion of a package including at least a conductive ball according to some exemplary embodiments. FIG. 3B shows an enlarged view of the conductive balls 400 of the package structure 10(20) formed in the step shown in FIG. 1I (or FIG. 2) in accordance with another embodiment. The embodiment shown in FIG. 3B is similar to the embodiment shown in FIG. 3A, hence the same reference numerals will be used to refer to the same or like parts, and its detailed description will be omitted herein. The difference between the embodiment of FIG. 3B with the embodiment of FIG. 3A lies in the design of the conductive balls 400. In some embodiments, the shape of the conductive balls 400, for example, may be adjusted based on an amount of the second conductive portions 304 used. Similar to the embodiment of FIG. 3A, the conductive balls 400 of FIG. 3B may have a ball foot 410 (first terminal) with a first width D1, a ball waist 430 with a second width D2 and a ball head 420 (second terminal) with a third width D3.

As illustrated in the embodiment of FIG. 3B, each of the conductive balls 400 satisfies the relationship: D1>D3≈D2 or D1>D3>D2. That is, the third width D3 of the ball head 420 (second terminal) may be substantially equal to the second width D2 of the ball waist 430, whereas both of the third width D3 and the second width D2 are smaller than the first width D1 of ball foot 410 (first terminal). In certain embodiments, the formed conductive balls 400 have a calabash shape. In some embodiments, the ball foot 410 is shaped like a middle-wide curved barrel, while the ball head 420 is shaped like a cylinder or barrel. That is, in some embodiments, when viewed from the cross-section along the height direction, the ball foot 410 may have curved sidewalls, while the ball head 420 do not have curved sidewalls. In some embodiments, the first width D1 is a maximum width of the ball foot 410 (first terminal), whereas the third width D3 is a maximum width of the ball head 420 (second terminal), measuring along the plane parallel to the surface 300a of the circuit substrate 300. In certain embodiments, the second width D2 is a minimum width of the ball waist 430, measuring along the plane parallel to the surface 300a of the circuit substrate 300. In some embodiments, the second width D2 of the ball waist 430 is slightly smaller than the third width D3 of the ball head 420 (second terminal). In certain embodiments, the ball foot 410 of the first width D1 is the widest portion of each of the conductive balls 400. In other words, the ball waist 430 of the second width D2 is the narrowest portion of the conductive ball 400, while the ball head 420 is substantially about the same or slightly wider than the ball waist 430. Furthermore, in some embodiments, when each of the conductive balls satisfies the relationship of D1>D3≈D2, a ratio of D1:D2:D3 is in a range of 1.1:1.0:1.0 to 1.2:1.1:1.1. In certain embodiments, the first width D1 is in a range of 220 μm to 240 μm, the second width D2 is in a range of 200 μm to 220 μm, and the third width D3 is in a range of 200 μm to 220 μm, but the disclosure is not limited thereto.

In the above-mentioned embodiments, through the formation of the upholding layer surrounding the first conductive portions, the conductive balls in the package structure of the disclosure are formed with a controlled shape having at least the ball waist located between the ball foot and the ball head, so as the stress may be shifted away from the connection portions. Due to the modified ball structure having a narrower waist, the stress from the circuit substrate or die is transferred to the ball waist, thus alleviating the stress or strain at the ball head or the ball foot. As such, ball fatigue and peeling or delamination between the connection structures can be reduced and thermal cycle reliability of the ball connection structures can be improved as compared to conventional ball (solder) structures.

In accordance with some embodiments of the present disclosure, a package structure including a circuit substrate, a semiconductor die, a redistribution layer, a plurality of conductive balls and a circuit substrate is provided. The redistribution layer is disposed on the semiconductor die, and being electrically connected to the semiconductor die. The plurality of conductive balls is disposed between the redistribution layer and the circuit substrate. The semiconductor die is electrically connected to the circuit substrate through the conductive balls. Each of the conductive balls has a ball foot with a first width D1, a ball head with a third width D3 and a ball waist with a second width D2 located between the ball foot and the ball head. The ball foot is connected to the redistribution layer, the ball head is connected to the circuit substrate, and the ball waist is the narrowest portion of each of the conductive balls.

In accordance with another embodiment of the present disclosure, a package structure including an encapsulated semiconductor die, a redistribution layer, conductive balls, a circuit substrate and an upholding layer is provided. The redistribution layer is disposed on the encapsulated semiconductor die. The plurality of conductive balls is disposed on the redistribution layer, wherein each of the conductive balls has a first terminal having curved sidewalls, a second terminal having sidewalls, and a ball waist between the curved sidewalls of the first terminal and the sidewalls of the second terminal. The first terminal is between the redistribution layer and the ball waist, and the ball waist is the narrowest portion of each of the conductive balls. The circuit substrate is disposed on the plurality of conductive balls and being electrically connected to the redistribution layer through the conductive balls, wherein the second terminal is between the ball waist and the circuit substrate. The upholding layer is located on the redistribution layer, wherein an upper surface of the upholding layer is leveled with the ball waist.

In accordance with yet another embodiment of the present disclosure a method of fabricating a package structure is described. The method of fabricating the package structure includes the following steps. A semiconductor die is provided. A redistribution layer is formed on the semiconductor die. A plurality of first conductive portions is disposed on the redistribution layer. An upholding layer is formed to partially cover the first conductive portions. A circuit substrate and a plurality of second conductive portions is provided on the plurality of first conductive portions, wherein the plurality of second conductive portions is located in between the circuit substrate and the plurality of first conductive portions. The plurality of the second conductive portions are joined with the plurality of first conductive portion to form a plurality of conductive balls by performing a reflow process, wherein the circuit substrate is electrically connected to the redistribution layer through the plurality of conductive balls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a first substrate having conductive pads;
   a second substrate having conductive layers;
   a plurality of conductive balls disposed in between the conductive pads of the first substrate and the conductive layers of the second substrate, the plurality of conductive balls is physically joined and in contact with the conductive pads and the conductive layers, and electrically connecting the conductive pads to the conductive layers, wherein each of the conductive balls has a calabash shape with curved sidewalls, and the curved sidewalls extend beyond a lateral dimension of the conductive pads of the first substrate.

2. The structure according to claim 1, wherein the conductive balls having the calabash shape includes a ball head, a ball foot and a waist portion, the ball head is connected to the conductive pads, the ball foot is connected to the conductive layers and has the curved sidewalls, the waist portion is located between the ball head and the ball foot and joining the ball head to the ball foot.

3. The structure according to claim 2, wherein the ball foot has a first width D1, the waist portion has a second width D2, the ball head has a third width D3, and the waist portion having the second width D2 is the narrowest portion of the conductive balls.

4. The structure according to claim 3, wherein each of the conductive balls satisfies the relationship of D3>D1>D2, and a ratio of D1:D2:D3 is in a range from 1.1:1.0:1.5 to 1.2:1.1:1.25.

5. The structure according to claim 3, wherein each of the conductive balls satisfies the relationship of D1>D3≥D2, and a ratio of D1:D2:D3 is in a range of 1.1:1.0:1.0 to 1.2:1.1:1.1.

6. The structure according to claim 1, further comprising an upholding layer located on the second substrate and partially covering the plurality of conductive balls.

7. The structure according to claim 6, wherein an air gap exists in between an upper surface of the upholding layer and a top surface of the first substrate, and portions of the conductive balls are exposed from the upholding layer and exposed to the air gap.

8. A structure, comprising:
   a plurality of conductive balls, wherein each of the conductive balls has a first terminal having curved sidewalls, a second terminal having sidewalls, and a ball waist between the curved sidewalls of the first terminal and the sidewalls of the second terminal, and the ball waist is the narrowest portion of each of the conductive balls;
   a package comprising dielectric layers and conductive layers, wherein the conductive layers is joined with the first terminals of the conductive balls, and the dielectric layers partially covers the curved sidewalls of the first terminals;
   a circuit substrate having conductive pads joined with the second terminals of the conductive balls;
   an upholding layer located on the dielectric layers of the package and partially covering the curved sidewalls of the first terminals, and an upper surface of the upholding layer is leveled with the ball waist.

9. The structure according to claim 8, wherein the curved sidewalls of the first terminal extend beyond a lateral dimension of the conductive pads of the circuit substrate.

10. The structure according to claim 8, wherein an air gap exists in between the upper surface of the upholding layer and a top surface of the circuit substrate, and the sidewalls of the second terminal are exposed from the upholding layer and exposed to the air gap.

11. The structure according to claim 8, wherein a height of the upholding layer is about half of a height of the plurality of conductive balls.

12. The structure according to claim 8, wherein the first terminal has a first width D1, the ball waist has a second width D2, and the second terminal has a third width D3, each of the conductive balls satisfies the relationship of D3>D1>D2, and a ratio of D1:D2:D3 is in a range from 1.1:1.0:1.5 to 1.2:1.1:1.25.

13. The structure according to claim 8, wherein the first terminal has a first width D1, the ball waist has a second width D2, and the second terminal has a third width D3, each of the conductive balls satisfies the relationship of D1>D3≥D2, and a ratio of D1:D2:D3 is in a range of 1.1:1.0:1.0 to 1.2:1.1:1.1.

14. The structure according to claim 8, wherein the first terminal has a width D1 that is the widest portion of the first terminal, a portion of the first terminal joined with the conductive layers is narrower than the width D1, and a portion of the first terminal joined with the second terminal at the ball waist is narrower than the width D1.

15. The structure according to claim 14, wherein the second terminal has a width D3 that is the widest portion of the second terminal, a portion of the second terminal joined with the conductive pads is narrower than the width D3, and a portion of the second terminal joined with the first terminal at the ball waist is narrower than the width D3.

16. A method of fabricating a package structure, comprising:
providing a package having conductive layers;
forming a plurality of first conductive portions on the conductive layers;
after forming the plurality of first conductive portions on the conductive layers, performing a partial melting process to partially melt the plurality of first conductive portions;
providing a circuit substrate and a plurality of second conductive portions on the circuit substrate;
mounting the package on the circuit substrate so that the plurality of second conductive portions is located in between the circuit substrate and the plurality of first conductive portions; and
joining the plurality of the second conductive portions with the plurality of the first conductive portions to form a plurality of conductive balls by performing a reflow process, wherein the circuit substrate is electrically connected to the package through the plurality of conductive balls.

17. The method according to claim 16, further comprising forming an upholding layer after the partial melting process to partially cover the first conductive portions.

18. The method according to claim 16, wherein a height of the first conductive portions and a height of the second conductive portions is reduced after forming the plurality of conductive balls by performing the reflow process.

19. The method according to claim 16, wherein the partial melting process is performed at a same temperature range as the reflow process.

20. The method according to claim 16, wherein joining the plurality of the second conductive portions with the plurality of the first conductive portions to form the plurality of conductive balls comprises forming ball waists of the plurality of the conductive balls at an interface where the plurality of the second conductive portions is joined with the plurality of the first conductive portions.

* * * * *